United States Patent [19]

Hattori et al.

[11] Patent Number: 4,562,361

[45] Date of Patent: Dec. 31, 1985

[54] POWER SWITCHING TRANSISTOR DRIVE CIRCUIT

[75] Inventors: Masayuki Hattori, Hachioji; Shigeo Nakamura; Osamu Yairo, both of Hino, all of Japan

[73] Assignee: Fanuc Ltd, Minamitsuru, Japan

[21] Appl. No.: 483,000

[22] PCT Filed: Aug. 7, 1982

[86] PCT No.: PCT/JP82/00308

§ 371 Date: Mar. 30, 1983

§ 102(e) Date: Mar. 30, 1983

[87] PCT Pub. No.: WO83/00591

PCT Pub. Date: Feb. 17, 1983

[30] Foreign Application Priority Data

Aug. 7, 1981 [JP] Japan .................. 56-123760

[51] Int. Cl.$^4$ .................. H03K 3/01; H03K 3/26
[52] U.S. Cl. .................. 307/270; 307/246; 307/254; 307/259
[58] Field of Search .............. 307/255, 254, 253, 270, 307/259, 256, 246, 570

[56] References Cited

U.S. PATENT DOCUMENTS 3,610,963  10/1971  Higgins .................. 307/275
3,820,008  6/1974   Guarnaschelli .......... 323/17
3,983,418  9/1976   Wallace ................ 307/270
4,481,431  11/1984  Nishino et al. ......... 307/300

FOREIGN PATENT DOCUMENTS 55-34808   3/1980  Japan .
55-128923  10/1980 Japan .
57-67328   4/1982  Japan .

Primary Examiner—Stanley D. Miller
Assistant Examiner—Richard Roseen
Attorney, Agent, or Firm—Staas & Halsey

[57] ABSTRACT

A power switching transistor drive circuit including a preamplifier (PAP), a base circuit (BSC) for driving a power switching transistor (QL), and a pulse transformer (PT) for electromagnetically coupling the preamplifier (PAP) and the base circuit (BSC). The power switching transistor (QL), which is connected to the output of the vbase circuit (BSC), being on/off controlled based on an input signal applied to the preamplifier (PAP). The preamplifier (PAP) is provided with a low impedance circuit connected in series with the primary coil of the pulse transformer (PT) and forming a closed circuit with the primary coil in response to a flyback voltage generated in the secondary coil of the pulse transformer (PT).

4 Claims, 5 Drawing Figures

POWER SWITCHING TRANSISTOR DRIVE CIRCUIT

BACKGROUND OF THE INVENTION

This invention relates to a power switching transistor drive circuit and, more particularly, to a power switching transistor drive circuit capable having a diminishing power loss at turn off and turn on, and of shortened storage time.

A drive circuit for a power switching transistor, which is used in, e.g., switching-type stabilized power supplies relying upon pulse-width modulation, is required to effect switching at a high frequency owing to the demand for smaller power supplies. If the power switching transistor is merely turned on and off, repeatedly, a greater number of times in view of the need for higher frequency, the power loss due to switching will increase. Furthermore, the power switching transistor has an operating delay, during which storage time control can no longer be carried out. Specifically, the transistor possesses a control dead time. Since the dead time is fixed, a rise in the switching rate increases the proportion of dead time in terms of time and narrows the range of control effected by the pulse width modulation operation. To realize the higher frequency, therefore, various circuits have been proposed and put into practical use in pursuit of reduced power loss during the on/off operation of power switching transistors, as well as a shorter storage time.

FIG. 1 is a circuit diagram of a power switching transistor drive circuit according to the prior art. In the Figure, PAP represents a preamplifier which current-amplifies a pulse signal Pi, serving as a control signal, applied thereto, for supplying a pulse current to the primary coil of a power transistor, described later. QL represents a power switching transistor, BSC a base circuit for driving the power switching transistor QL, and PT a pulse transformer for electromagnetically coupling the preamplifier PAP and base circuit BSC.

In the drive circuit, the preamplifier PAP receives the current-amplifies the pulse signal Pi and supplies the primary coil of the pulse transformer PT with a pulse current IP. Meanwhile, the base circuit BSC drives the power transistor QL into conduction by a pulse current IS generated in the secondary coil in response to the pulse current IP. At this time, however, a current charging a speed-up capacitor CB in the base circuit is added as a base current, so that the base current temporarily grows large in magnitude and the turn-on time of the transistor QL shortens. When the power switching transistor QL turns on, a Baker clamping diode DB clamps the transistor QL to a state just prior to saturation, thereby functioning to prevent over-drive. When the pulse signal Pi subsequently vanishes, the pulse current IP ceases to flow, the electromagnetic energy which has accumulated in the primary coil of the pulse transformer PT is released in the form of a flyback voltage and a reverse voltage is generated in the secondary coil of the pulse transformer PT to reverse bias the transistor QL. Now the charge which has accumulated in the capacitor CB also is released, in the direction indicated by the dashed-line arrow, so that, in conjunction with the action of the Baker clamping diode DB, the storage time of the transistor QL is shortened and the on/off operation is hastened.

Thus, with the drive circuit of FIG. 1, storage time can be shortened considerably in comparison with the hitherto available art. The effect, however, is less than satisfactory.

Accordingly, an object of the present invention is to provide a novel drive circuit, particularly a preamplifier, capable of shortening storage time sufficiently and of reducing power loss at turn-on and turn-off.

SUMMARY OF THE INVENTION

The invention includes a power switching transistor drive circuit having a base circuit for driving a power switching transistor intermittently supplying a load with power, a pulse transformer having a secondary coil connected to the input of the base circuit, and a preamplifier which, in accordance with an input signal, renders intermittent, a current flowing in a primary coil of the pulse transformer. The device also includes a low impedance circuit connected in series with the primary coil of the pulse transformer and forming a closed circuit with the other primary coil in response to a flyback voltage generated in the secondary coil of the pulse transformer. The power switching transistor, connected to the output of the base circuit, is controlled for intermittent operation based on an input signal applied to the preamplifier. In the present invention, the low impedance circuit can be constructed of a diode and transistor in the on state and provided on the input side of the preamplifier. The arrangement is such that the low impedance circuit is connected to the primary coil of the pulse transformer so as to pass a current therethrough when a flyback voltage is generated in the secondary coil of the pulse transformer.

DESCRIPTION OF THE PREFERRED EMBODIMENTS

Reference will now be made to the accompanying drawings to describe the present invention in greater detail.

Figure 1:
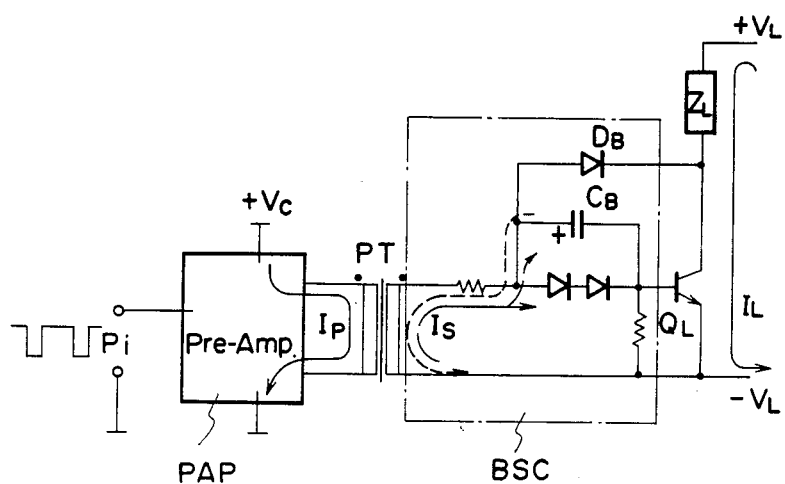
FIG. 1 is a circuit diagram of a power switching transistor drive circuit according to the prior art.
Figure 2:
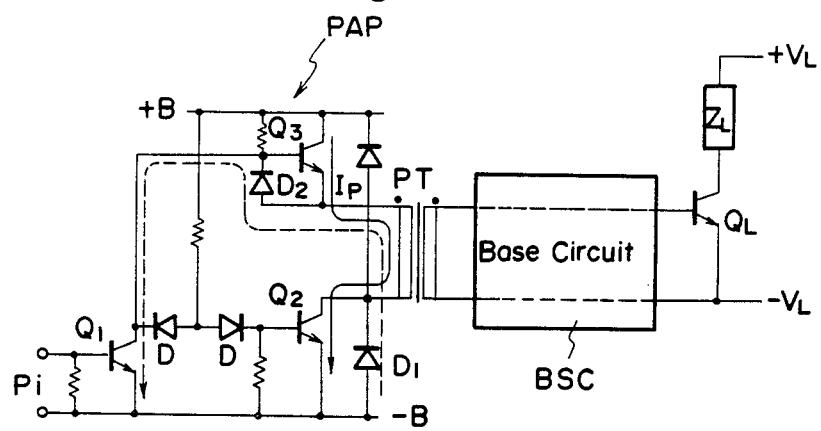
FIGS. 2 through 5 are circuit diagrams of various embodiments of power switching transistor drive circuits according to the present invention.

FIG. 2 is a power switching transistor drive circuit according to the present invention. In the circuit of the present invention, the base circuit BSC has a construction similar to that of the conventional circuit shown in FIG. 1, and is represented by a block, the contents of which are described again. Also, portions the same as those of the conventional apparatus are designated by like reference characters and are not described again.

According to the present invention, the preamplifier PAP has the following construction. Specifically, the preamplifier includes an input transistor Q1 which is turned on when the pulse signal Pi, namely the input signal, is at a high level, a drive transistor Q2 having an emitter connected to a −B power supply and a collector connected to one end of the primary coil of the pulse transformer PT, and a drive transistor Q3 having a collector connected to a +B power supply and an emitter connected to the other end of the primary coil of the pulse transformer PT. The base of the drive transistor Q2 is connected to the collector of the transistor Q1 through diodes D and D. The base of the drive transistor Q3 is connected directly to the collector of the transistor Q1, a diode D1 is connected between the collector and emitter of the drive transistor Q2, and a diode D2 is connected between the base and emitter of the drive transistor Q3.

When the transistor Q1 in the preamplifier PAP is turned off in the above circuit, the transistors Q2 and Q3 are turned on and a pulse current IP flows along the path indicated by the solid-line arrow. As described in connection with FIG. 1, the power switching transistor QL conducts owing to the function performed by the base circuit BSC. When transistor Q1 is turned on by the pulse signal Pi, the drive transistors Q2 and Q3 are turned off. When this occurs, a closed circuit indicated by the dashed-line arrow is formed, namely a current path extending from diode D1 to transistor Q1 via the primary coil and diode D2. The series circuit comprising the diodes D1 and D2 and transistor Q1, forming the current path indicated by the dashed line, exhibits a low impedance and increases the reverse bias current of the power switching transistor QL, which is generated by the secondary coil. The result is to hasten the turn off action of the power switching transistor QL and shorten the storage time. Further, since the closed circuit indicated by the dashed line acts as a steady, low impedance circuit when the preamplifier PAP is in the off state, the base circuit BSC is held stable while the power switching transistor QL is in the off state.

Figure 3:
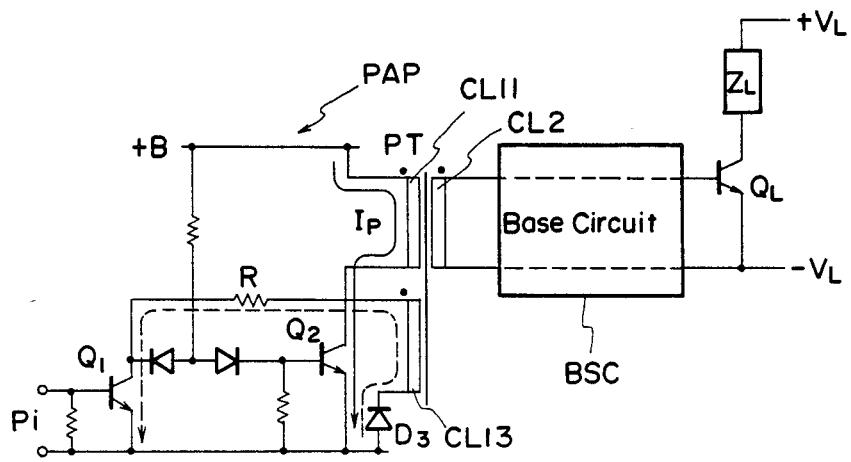

FIG. 3 is a circuit diagram of another embodiment of the present invention. In this embodiment, the pulse transformer PT is provided with a primary coil CL11 and with a separate primary coil CL13. An impedance circuit (a series circuit comprising a diode D3, low resistance R and the transistor Q1) is connected to the separately provided primary coil CL13.

When the transistor Q1 in the preamplifier PAP is turned off, the transistor Q2 is turned on and a pulse current IP flows along the path indicated by the solid-line arrow. As described in connection with FIG. 1, the power switching transistor QL conducts owing to the function performed by the base circuit BSC. When the transistor Q1 is turned on by the pulse signal Pi, the drive transistor Q2 is turned off. When this occurs, a closed circuit indicated by the dashed-line arrow is formed, namely a current path extending from diode D3 to transistor Q1 via the primary coil CL13 and low resistance R. The series circuit connected serially to the primary coil CL13 and comprising the diode D3, low resistance R and transistor Q1, forming the current path indicated by the dashed line, exhibits a low impedance and increases the reverse bias current of the power switching transistor QL, which is generated by the secondary coil CL2. The result is to hasten the turn off action of the power switching transistor QL and shorten the storage time. Further, since the closed circuit indicated by the dashed line acts as a steady, low impedance circuit when the preamplifier PAP is in the off state, the base circuit is held stable while the power switching transistor QL is in the off state.

Figure 4:
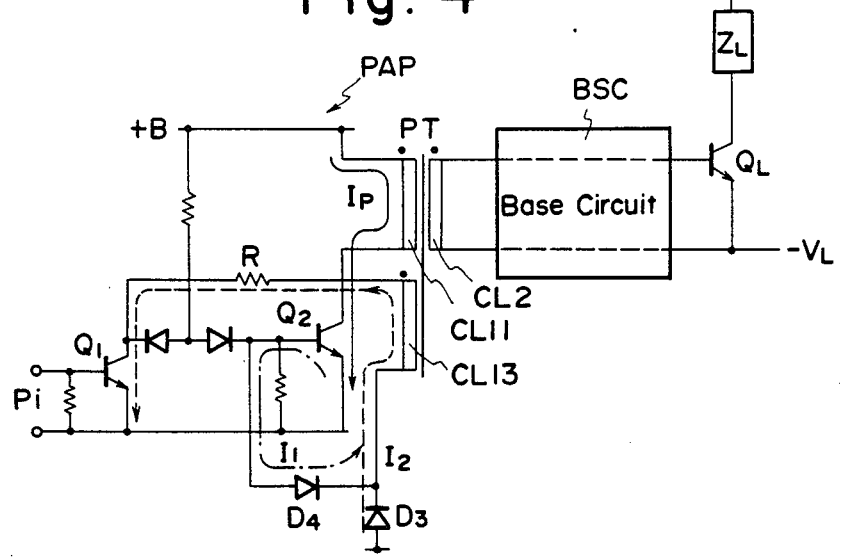

FIG. 4 is a diagram of a further embodiment of the present invention, differing from the drive circuit of FIG. 3 only by the addition of a diode D4.

When the transistor Q1 is switched from the off to the on state under conditions where the drive transistor Q2 is on and the pulse current IP is flowing into the primary coil CL11, a closed circuit indicated by the one-dot chain line is formed. A base charge which has accumulated in the drive transistor Q2, is forcibly extracted, shortening the storage time of the drive transistor Q2. When the drive transistor Q2 turns off, the flow of the pulse curent IP ceases and a current path (dashed line) for a current I2 is formed with respect to the flyback voltage. Thereafter, as described in connection with FIG. 3, the reverse bias current of transistor QL increases and the power switching transistor QL is turned off. According to the circuit shown in FIG. 4, therefore, it is possible to shorten the storage time of the drive transistor Q2 in the preamplifier PAP and shorten the switching time of the power switching transistor QL even more. This effect supplements that exhibited by the arrangement of FIG. 3.

Figure 5:
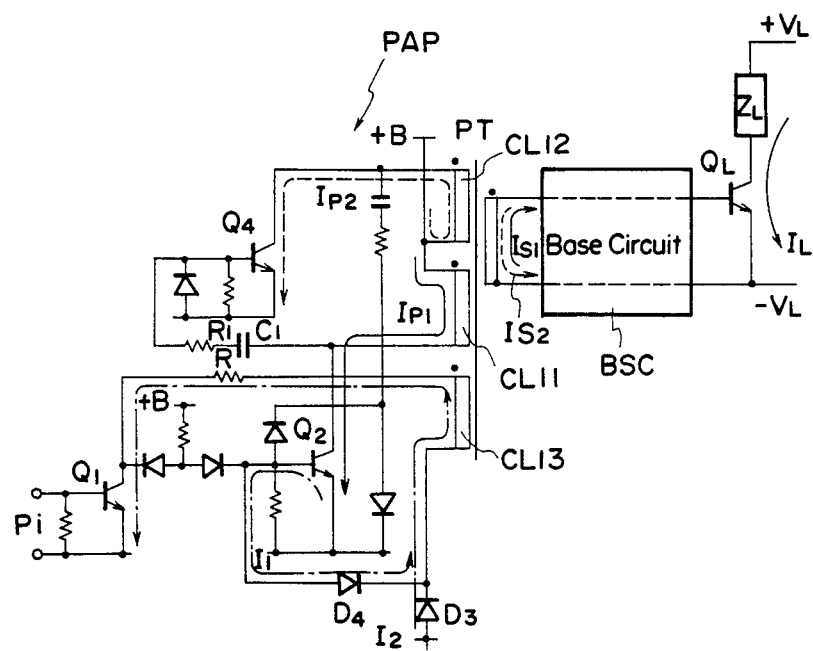

FIG. 5 is a circuit diagram of another embodiment of a power switching transistor drive circuit according to the present invention. Fundamentally, the circuit differs from that illustrated in FIG. 4 in the following aspects:

(a) the pulse transformer PT is provided with a driving primary coil C11, a first primary coil CL13 and a second primary coil C12, and (b) the junction of the primary coil CL11 for drive and the second primary coil CL12 is connected to the power supply +B, and the other end of the second primary coil C12 is connected to a switching transistor Q4, forming a current path indicated by the dashed line.

When the transistor Q1 is off, transistor Q2 is on, so that a pulse current IP1 flows through the first primary coil CL11 for drive along the path indicated by the solid-line arrow, whereby a pulse current IS1 flows into the base of the power switching transistor QL, the latter being conductive.

When the transistor Q1 is switched from the off to the on state under these conditions, three current paths are formed, indicated by the dashed lines and one-dot chain line. Owing to the current path I1 indicated by the one-dot chain line passing through the first primary coil CL13, the base charge accumulated in the drive transistor Q2 is forcibly extracted to shorten the storage time thereof, as described in conjunction with FIG. 4. When the drive transistor Q2 becomes non-conductive, on the other hand, a base current flows into the switching transistor Q4 through a time constant circuit comprising a capacitor C1 and resistor R1, whereby the switching transistor Q4 is turned on, and a pulse current IP2 flows into the third primary coil CL12, for a fixed period of time decided by the time constant circuit C1R1. In consequence, the reverse bias current suddenly increases in magnitude so that the power switching transistor QL turns off for a short time. A closed circuit I2 functions to increase the reverse bias current and to hold the base circuit stable.

According to the present invention as described above, the storage time of a switching transistor can be shorted and power loss reduced. Further, since it is possible to achieve high-frequency switching, the invention is applicable to switching-type stabilized power supplies, making possible a reduction in the size thereof.

We claim:

1. A power switching transistor drive circuit, operatively connected to receive an input signal and operatively connected to a load, comprising:

a power switching transistor, operatively connected to the load, for intermittently supplying the load with power;

a base circuit having an input terminal and an output terminal, operatively connected to said power switching transistor, for driving said power switching transistor;

a pulse transformer, operatively connected to said base circuit, having a secondary coil connected to the input of said base circuit for generating a flyback voltage and having a primary coil having first and second ends;

first and second drive transistors, respectively, operatively connected to the first and second ends of said primary coil, for intermittently rendering a current to flow in said primary coil of said pulse transformer; and a preamplifier having an input side operatively connected to receive the input signal, and having an output side, for intermittently rendering the current to flow in said primary coil of said pulse transformer, said preamplifier comprising:

a low impedance circuit, operatively connected in series with said primary coil of said pulse transformer, for forming a closed circuit with said primary coil in response to the flyback voltage generated in said secondary coil of said pulse transformer, said power switching transistor being controlled for intermittent operation based on the input signal applied to said preamplifier, said low impedance circuit including:

a first diode operatively connected between the collector and emitter of said first drive transistor;

a second diode operatively connected between the base and emitter of said second drive transistor; and a transistor operatively connected to the input side of said preamplifier.

2. A power switching transistor drive circuit operatively connected to a load and operatively connected to receive an input signal, comprising:

a power switching transistor, operatively connected to the load, for intermittently supplying the load with power;

a base circuit having an input terminal and an output terminal, operatively connected to said power switching transistor, for driving said power switching transistor;

a pulse transformer having two primary coils and a secondary coil, operatively connected to the input terminal of said base circuit, said secondary coil generating a flyback voltage; and a preamplifier, operatively connected to said pulse transformer and operatively connected to receive the input signal, for intermittently rendering a current to flow in one of said primary coils of said pulse transformer, comprising:

a low impedance circuit, operatively connected in series with the other one of said primary coils of said pulse transformer, forming a closed circuit with the other one of said primary coils in response to the flyback voltage generated in said secondary coil of said pulse transformer, said power switching transistor being intermittently controlled in accordance with the input signal applied to said preamplifier, said low impedance circuit including:

a diode;

a resistor operatively connected to said diode; and a transistor operatively connected to said resistor and to the input side of said preamplifier.

3. A power switching transistor drive circuit operatively connected to a load and operatively connected to receive an input signal, comprising:

a power switching transistor, operatively connected to the load, for intermittently supplying the load with power;

a base circuit having an input terminal, and having an output terminal operatively connected to said power switching transistor, for driving said power switching transistor;

a pulse transformer having a driving primary coil and first and second primary coils and a secondary coil, operatively connected to the input terminal of said base circuit, said secondary coil generating a flyback voltage; and a preamplifier, having an input side operatively connected to receive the input signal and operatively connected to said pulse transformer, for intermittently rendering a current to flow in said driving primary coil of said pulse transformer, comprising:

a switching transistor, operatively connected to said secondary coil and said second primary coil, for conducting a current through said second primary coil for a fixed time period when the flyback voltage is generated in said secondary coil;

a low impedance circuit, operatively connected in series with said first primary coil of said pulse transformer, forming a closed circuit with said first primary coil, in response to the flyback voltage generated in said secondary coil of said pulse transformer, and with said switching transistor, said power switching transistor, operatively connected to the output terminal of said base circuit, being intermittently controlled in accordance with the input signal applied to said preamplifier.

4. A power switching transistor drive circuit according to claim 3, wherein said low impedance circuit comprises:

a diode;

a resistor operatively connected to said diode; and a transistor operatively connected to said resistor and to the input side of said preamplifier.

* * * * *

UNITED STATES PATENT AND TRADEMARK OFFICE
CERTIFICATE OF CORRECTION

PATENT NO. : 4,562,361
DATED : DECEMBER 31, 1985
INVENTOR(S) : MASAYUKI HATTORI ET AL.

It is certified that error appears in the above-identified patent and that said Letters Patent is hereby corrected as shown below:

FRONT PAGE [57] ABSTRACT, line 7, "vbase" should be --base--.

Col. 1, line 9, "having a" should be --of--;
       line 10, "of" should be --having--;
       line 17, delete "greater";
       line 42, "the" (first occurrence) should be --and--.

Col. 4, line 26, delete "for drive" and insert --and--.

Signed and Sealed this

Twenty-fifth Day of March 1986

[SEAL]

Attest:

DONALD J. QUIGG

Attesting Officer

Commissioner of Patents and Trademarks